US010698282B2

United States Patent
Dai et al.

(10) Patent No.: US 10,698,282 B2
(45) Date of Patent: Jun. 30, 2020

(54) DISPLAY SUBSTRATE, DISPLAY DEVICE AND METHOD FOR DRIVING DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Ke Dai, Beijing (CN); Peng Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 16/162,521

(22) Filed: Oct. 17, 2018

(65) Prior Publication Data
US 2019/0049806 A1 Feb. 14, 2019

Related U.S. Application Data

(63) Continuation of application No. PCT/CN2017/103089, filed on Sep. 25, 2017.

(30) Foreign Application Priority Data
Feb. 21, 2017 (CN) .......................... 2017 1 0092874

(51) Int. Cl.
G02F 1/1362 (2006.01)
H01L 27/12 (2006.01)
(Continued)

(52) U.S. Cl.
CPC .. *G02F 1/136286* (2013.01); *G02F 1/134363* (2013.01); *G09G 3/3607* (2013.01);
(Continued)

(58) Field of Classification Search
CPC .............. G01Q 60/30; G02F 1/134363; G02F 1/136286; G02F 2201/121;
(Continued)

(56) References Cited

U.S. PATENT DOCUMENTS

2002/0008794 A1* 1/2002 Song ................. G02F 1/136204
349/40
2010/0118221 A1* 5/2010 Kim ................... G02F 1/136286
349/39
(Continued)

FOREIGN PATENT DOCUMENTS

CN 101738800 A 6/2010
CN 102737596 A 10/2012
(Continued)

OTHER PUBLICATIONS

International Search Report and Written Opinion for Application No. PCT/CN2017/103089, dated Jan. 4, 2018, 20 Pages.

*Primary Examiner* — Richard J Hong
(74) *Attorney, Agent, or Firm* — Brooks Kushman P.C.

(57) ABSTRACT

A display substrate, a display device and a driving method thereof are provided. The display substrate includes a plurality of gate lines and a plurality of data lines. The plurality of gate lines crosses the plurality of data lines to define a plurality of sub-pixel regions. Each of the plurality of sub-pixel regions includes a TFT connected to one of the plurality of data lines. Two rows of sub-pixel regions are arranged between every two adjacent gate lines, and two data lines of the plurality of data lines are arranged between every two adjacent columns of sub-pixel regions. TFTs in two adjacent rows of sub-pixel regions at two sides of one gate line of the plurality of gate lines are connected to the gate line and connected to different data lines.

18 Claims, 7 Drawing Sheets

(51) Int. Cl.
*G02F 1/1343* (2006.01)
*G09G 3/36* (2006.01)

(52) U.S. Cl.
CPC ......... *G09G 3/3614* (2013.01); *G09G 3/3688* (2013.01); *H01L 27/124* (2013.01); *G02F 2201/121* (2013.01)

(58) Field of Classification Search
CPC ......... G02F 1/136227; G02F 1/133553; G02F 1/136204; G09G 3/3607; G09G 3/3614; G09G 3/3688; H01L 27/124; H02S 50/15; G02B 30/27
See application file for complete search history.

(56) References Cited

U.S. PATENT DOCUMENTS

| | | | | |
|---|---|---|---|---|
| 2012/0025198 A1* | 2/2012 | Ho | ........................ | H01L 27/124 257/72 |
| 2012/0069286 A1* | 3/2012 | Huang | .............. | G02F 1/136227 349/147 |
| 2012/0249492 A1 | 10/2012 | Kim et al. | | |
| 2014/0198099 A1* | 7/2014 | Tseng | ..................... | G02B 30/27 345/419 |
| 2015/0035167 A1* | 2/2015 | Wang | ................. | G02F 1/136286 257/774 |
| 2015/0145898 A1* | 5/2015 | Hwang | ................ | G09G 3/3688 345/690 |
| 2015/0294986 A1* | 10/2015 | Moon | ............... | G02F 1/136286 257/773 |
| 2015/0372015 A1* | 12/2015 | Cheng | ................... | H01L 27/124 257/71 |
| 2017/0193934 A1* | 7/2017 | Liu | .................... | G02F 1/136286 |
| 2018/0046050 A1* | 2/2018 | Xu | .................... | G02F 1/133553 |

FOREIGN PATENT DOCUMENTS

| | | |
|---|---|---|
| CN | 106054481 A | 10/2016 |
| CN | 106707648 A | 5/2017 |
| JP | 2002214645 A | 7/2002 |

* cited by examiner

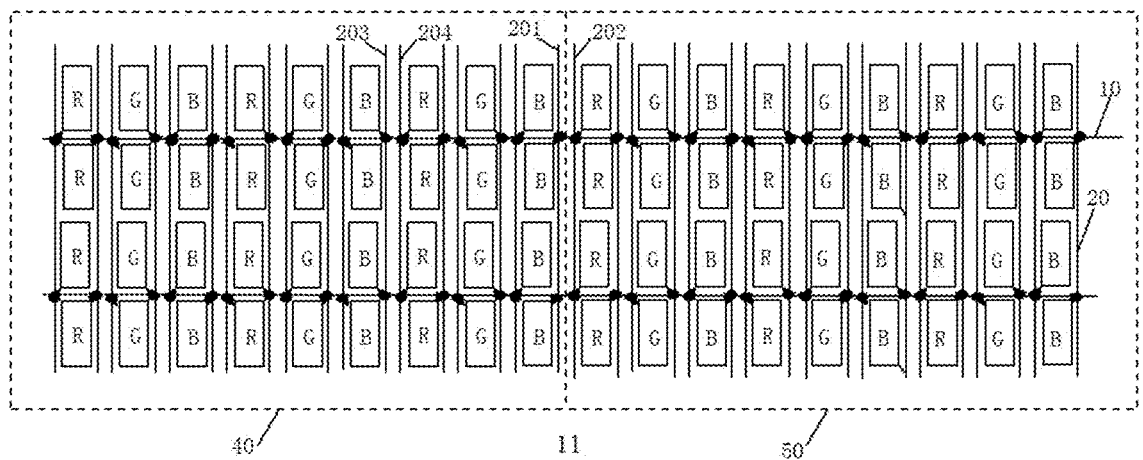
FIG. 4
FIG. 5A
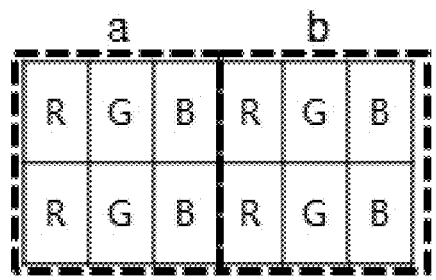
FIG. 5B

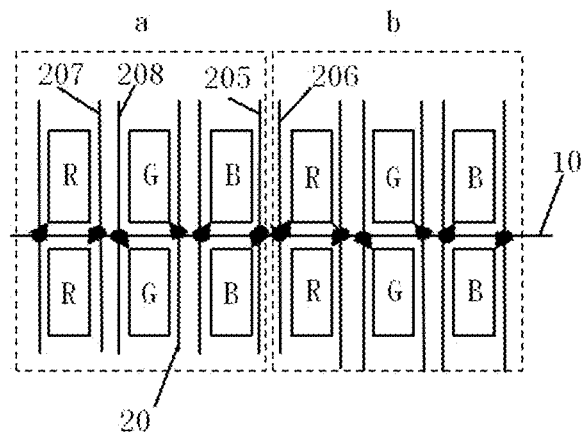
FIG. 5C
| a | b | a | b | a | b |
|---|---|---|---|---|---|
| b | a | b | a | b | a |
| a | b | a | b | a | b |
| a | b | a | b | a | b |
FIG. 5D
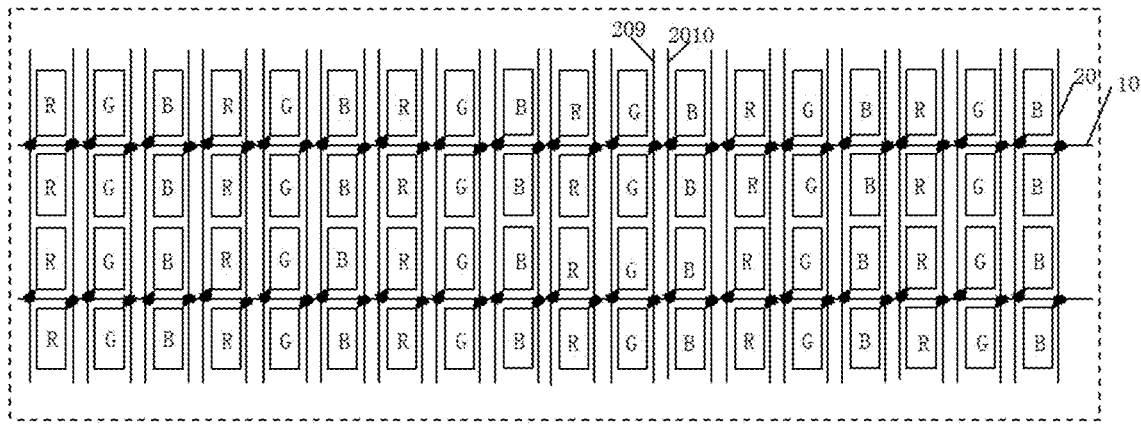
FIG. 5E

DISPLAY SUBSTRATE, DISPLAY DEVICE AND METHOD FOR DRIVING DISPLAY DEVICE

CROSS-REFERENCE TO RELATED APPLICATIONS

This application is a continuation-in-part application of PCT Application No. PCT/CN2017/103089 filed on Sep. 25, 2017, which claims priority to Chinese Patent Application No. 201710092874.8 filed on Feb. 21, 2017, which are hereby incorporated by reference in their entireties.

TECHNICAL FIELD

The present disclosure relates to the field of display technology, for example, to a display substrate, a display device and a method for driving the display device.

BACKGROUND

Thin film transistors (TFTs) have been widely used as driving elements in the flat-panel display technology due to such advantages as small volume, low power consumption and low manufacture cost.

For a TFT display device, each TFT of the TFT display device is turned on or off under the control of a gate line. When the TFT is turned on, a pixel voltage is applied to a corresponding pixel via a data line. A charge rate of a pixel is defined as a ratio of the pixel voltage applied to the pixel to a voltage applied to the data line, and the pixel voltage is related to a charge time and a turn-on current of the TFT. Taking a display device with a refresh rate of 120 Hz and a resolution of 3840*2160 pixels as an example, the pixels in each row are charged for a charge time t of 3.7 µs (t=1/120/2220 (60 rows of blank regions)). Within 3.7 µs, an amorphous-silicon (a-Si) TFT has relatively low carrier mobility, so it is impossible to fully charge the pixel within a short time period. At this time, the pixel voltage may be smaller than the voltage applied to the data line.

SUMMARY

A display substrate includes a plurality of gate lines and a plurality of data lines. The plurality of gate lines crosses the plurality of data lines to define a plurality of sub-pixel regions. Each of the plurality of sub-pixel regions includes one thin film transistor (TFT) connected to one of the plurality of data lines. Two rows of sub-pixel regions are arranged between two adjacent gate lines of the plurality of gate lines. Two data lines of the plurality of data lines are arranged between two adjacent columns of sub-pixel regions of the plurality of sub-pixel regions. TFTs in two adjacent rows of sub-pixel regions at two sides of one gate line of the plurality of gate lines are connected to the gate line and connected to different data lines.

In some embodiments of the present disclosure, the display substrate further includes a first common electrode line arranged parallel to the plurality of gate lines and arranged between two rows of sub-pixel regions which are arranged between the two adjacent gate lines.

In some embodiments of the present disclosure, the first common electrode line and the plurality of gate lines are arranged in a same layer.

In some embodiments of the present disclosure, the display substrate further includes a second common electrode line arranged parallel to the plurality of data lines and arranged between two adjacent columns of sub-pixel regions, where the second common electrode line and the plurality of data line are arranged in a same layer, and the first common electrode line crosses the second common electrode line.

In some embodiment of the present disclosure, the display substrate further includes an insulation layer arranged between the first common electrode line and the second common electrode line, where the insulation layer is provided with a via-hole at a position where an orthogonal projection of the first common electrode line onto the insulation layer crosses an orthogonal projection of the second common electrode line onto the insulation layer, and the first common electrode line is electrically connected to the second common electrode line through the via-hole.

In some embodiments of the present disclosure, the display substrate further includes at least one common electrode line arranged parallel to the plurality of data lines and arranged between two adjacent columns of sub-pixel regions.

In some embodiments of the present disclosure, the display substrate includes at least three common electrode lines, where the quantity of the sub-pixel regions between any two adjacent common electrode lines is s, and s is a positive integer.

In some embodiments of the present disclosure, the display substrate includes at least three common electrode lines, where any two adjacent common electrode lines are spaced apart from each other at an equal distance.

In some embodiments of the present disclosure, the display substrate includes at least three common electrode lines, where the quantity of sub-pixel regions in any row of sub-pixel regions and between any two adjacent common electrode lines is greater than or equal to 2.

In some embodiments of the present disclosure, each of the at least one common electrode line is arranged between two data lines which are arranged between two adjacent columns of sub-pixel regions.

In some embodiments of the present disclosure, a first data line and a second data line are arranged between the two adjacent columns of sub-pixel regions, the first data line is connected to a first TFT, the second data line is connected to a second TFT, a sub-pixel region where the first TFT is located and a sub-pixel region where the second TFT is located are arranged in adjacent rows of sub-pixel regions and in adjacent columns of sub-pixel regions, the sub-pixel region where the first TFT is located and the sub-pixel region where the second TFT is located are arranged at a first side of one of the plurality of gate lines and a second side of the one of the plurality of gate lines respectively; and a third TFT is connected to a third data line arranged at an edge of the display substrate, a fourth TFT is connected to a data line adjacent to the third data line, the third TFT and the fourth TFT are connected to a same gate line, and a sub-pixel region where the third TFT is located and a sub-pixel region where the fourth TFT is located are in a same column of sub-pixel regions and in adjacent rows of sub-pixel regions.

In some embodiments of the present disclosure, the display substrate is divided into a first region and a second region in a direction parallel to the plurality of data lines, the quantity of the sub-pixel regions in the first region is the same as the quantity of sub-pixel regions in the second region, and an arrangement of the sub-pixel regions in the first region is the same as an arrangement of the sub-pixel regions in the second region. A first data line and a second data line are arranged between the first region and the second region, the first data line is connected to a first TFT in the first region, the second data line is connected to a second TFT in the second region, a sub-pixel region where the first TFT is located and a sub-pixel region where the second TFT is located are arranged in adjacent rows of sub-pixel regions and in adjacent columns of sub-pixel regions, and the sub-pixel region where the first TFT is located and the sub-pixel region where the second TFT is located are arranged at a first side of one of the plurality of gate lines and a second side of the one of the plurality of gate lines respectively. In any of the first region and the second region, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, the sub-pixel region where the third TFT is located and the sub-pixel region where the fourth TFT is located are arranged at the first side and the second side respectively; and in any of the first region and the second region, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions.

In some embodiments of the present disclosure, the display substrate is divided into a plurality of region pairs, each of the plurality of region pairs includes a first pixel repetition unit and a second pixel repetition unit adjacent to each other in a direction parallel to the plurality of gate lines, any of the first pixel repetition unit and the second pixel repetition unit includes two sets of sub-pixel regions adjacent to each other in a direction parallel to the plurality of data lines, and each set of sub-pixel regions includes sub-pixel regions where sub-pixels of a plurality of colors and in a same row parallel to the plurality of gate lines are located. one of the plurality of gate lines is arranged between the two sets of sub-pixel regions, the quantity of the sub-pixel regions in the second pixel repetition unit is the same as the quantity of the sub-pixel regions in the first pixel repetition unit, and an arrangement of the sub-pixel regions in the second pixel repetition unit is the same as an arrangement of the sub-pixel regions in the first pixel repetition unit. A first data line and a second data line are arranged between the first pixel repetition unit and the second pixel repetition unit, the first data line is connected to a first TFT of the first pixel repetition unit, the second data line is connected to a second TFT of the second pixel repetition unit, and a sub-pixel region where the first TFT is located and a sub-pixel region where the second TFT is located are arranged in adjacent rows of sub-pixel regions and in adjacent columns of sub-pixel regions. In any of the first pixel repetition units and the second pixel repetition units, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, and the sub-pixel region where the third TFT is located and the sub-pixel region where the fourth TFT is located are arranged at a first side of the one of the plurality of gate lines and a second side of the one of the plurality of gate lines respectively; in any of the first pixel repetition units and the second pixel repetition units, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions.

In some embodiments of the present disclosure, one TFT in one sub-pixel region of two adjacent sub-pixel regions in a same column of subpixel regions is connected to a data line at a first side of the same column of subpixel regions, and one TFT in another sub-pixel region of the two adjacent sub-pixel regions in the same column of subpixel regions is connected to a data line at a second side of the same column of subpixel regions.

The present disclosure provides in some embodiments a display device including the above display substrate.

The present disclosure provides in some embodiments a method for driving a display device, including turning on TFTs in two adjacent rows of sub-pixel regions at two sides of one of a plurality of gate lines simultaneously through the one of the plurality of gate lines; and applying a pixel voltage to each of the TFTs through a plurality of data lines. The display device includes a display substrate. The display substrate includes the plurality of gate lines and the plurality of data lines. the plurality of gate lines crosses the plurality of data lines to define a plurality of sub-pixel regions. Each of the plurality of sub-pixel regions includes one TFT connected to one of the plurality of data lines. Two rows of sub-pixel regions are arranged between two adjacent gate lines, and two of the plurality of data lines are arranged between two adjacent columns of sub-pixel regions, and TFTs in the two adjacent rows of sub-pixel regions at two sides of one gate line of the plurality of gate lines are connected to the gate line and connected to different data lines.

In some embodiments of the present disclosure, the method further includes applying pixel voltages to a plurality of first sub-pixel regions in a condition that an image is being displayed, to form an electric field to drive liquid crystal molecules to be deflected. Among the pixel voltages applied to the plurality of first sub-pixel regions, the quantity of pixel voltages having a first polarity is the same as the quantity of pixel voltages having a second polarity opposite to the first polarity, and absolute values of the pixel voltages having the first polarity are the same as absolute values of the pixel voltages having the second polarity. In the condition that the image is being displayed, a display region of the display substrate includes the plurality of first sub-pixel regions and a plurality of other sub-pixel regions, and liquid crystal molecules in the plurality of other sub-pixel regions are incapable of being driving to be deflected by an electric field generated by pixel voltages applied to the plurality of other sub-pixel regions.

In some embodiments of the present disclosure, the method further includes:

applying a first group of pixel voltages to a plurality of sub-pixel regions in a first pixel region, where the first group of pixel voltages includes n first pixel voltages having a first polarity and m second pixel voltages having a second polarity, and one pixel voltage of the first group of pixel voltages is applied to one sub-pixel region in the first pixel region; and applying a second group of pixel voltages to a plurality of sub-pixel regions in a second pixel region, where the second group of pixel voltages includes p third pixel voltages having the first polarity and q fourth pixel voltages having the second polarity, and one pixel voltage of the second group of pixel voltages is applied to one sub-pixel region in the second pixel region, where n+p=m+q, and n, m, p and q are each a positive integer, where the display substrate is divided into a first region and a second region in a direction parallel to the plurality of data lines, the quantity of sub-pixel regions in the first region is the same as the quantity of sub-pixel regions in the second region, and an arrangement of the sub-pixel regions in the first region is the same as an arrangement of the sub-pixel regions in the second region;

a first data line and a second data line are arranged between the first region and the second region, the first data line is connected to a first TFT in the first region, the second data line is connected to a second TFT in the second region, a sub-pixel region where the first TFT is located and a sub-pixel region where the second TFT is located are arranged in adjacent rows of sub-pixel regions and in adjacent columns of sub-pixel regions, and the sub-pixel region where the first TFT is located and the sub-pixel region where the second TFT is located are arranged at two sides of one of the plurality of gate lines;

in any of the first region and the second region, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, the sub-pixel region where the third TFT is located and the sub-pixel region where the fourth TFT is located are arranged at two sides of one of the plurality of gate lines;

in any of the first region and the second region, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions; and in the condition that an image is being displayed, the display substrate includes the first pixel region and the second pixel region, the first pixel region includes bright-state sub-pixel regions in the first region, the second pixel region includes bright-state sub-pixel regions in the second region, and the quantity of sub-pixel regions in the first pixel region is the same as the quantity of sub-pixel regions in the second pixel region.

In some embodiments of the present disclosure, the first pixel region includes a first red pixel region, a first green pixel region and a first blue pixel region, and the first group of pixel voltages includes a first red pixel voltage having a positive polarity and applied to the first red pixel region, a first green pixel voltage having a negative polarity and applied to the first green pixel region, and a first blue pixel voltage having a positive polarity and applied to the first blue pixel region. The second pixel region includes a second red pixel region, a second green pixel region and a second blue pixel region, the second group of pixel voltages includes a second red pixel voltage having a positive polarity and applied to the second red pixel region, a second green pixel voltage having a negative polarity and applied to the second green pixel region, and a second blue pixel voltage having a positive polarity and applied to the second blue pixel region. Absolute values of the red pixel voltages, the green pixel voltages and the blue pixel voltages are the same.

In some embodiments of the present disclosure, the method further includes:

dividing a pixel region of the display substrate into a plurality of region pairs in a condition that an image is being displayed, where each of the plurality of region pairs includes a first pixel repetition unit and a second pixel repetition unit adjacent to each other in a direction parallel to the plurality of gate lines, the first pixel repetition unit includes two sets of sub-pixel regions adjacent to each other in a direction parallel to the plurality of data lines, each of the two sets of sub-pixel regions includes sub-pixel regions where sub-pixels of a plurality of colors and in a same row parallel to the plurality of gate lines are located, a first gate line is arranged between the two sets of sub-pixel regions, the quantity of sub-pixel regions in the second pixel repetition unit is the same as the quantity of sub-pixel regions in the first pixel repetition unit, an arrangement of the sub-pixel regions in the second pixel repetition unit is the same as an arrangement of the sub-pixel regions in the first pixel repetition unit, a first data line and a second data line are arranged between the first pixel repetition unit and the second pixel repetition unit, the first data line is connected to a first TFT of the first pixel repetition unit, the second data line is connected to a second TFT of the second pixel repetition unit, a sub-pixel region where the first TFT is located and a sub-pixel region where the second TFT is located are arranged in adjacent rows of sub-pixel regions and in adjacent columns of sub-pixel regions; in any of the first pixel repetition units and the second pixel repetition units, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, and the sub-pixel region where the third TFT is located and the sub-pixel region where the fourth TFT is located are arranged at two sides of one of the plurality of gate lines; in any of the first pixel repetition units and the second pixel repetition units, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions; and applying first pixel voltages to a first set of sub-pixel regions in the first pixel repetition unit at a first side of the first gate line, and applying second pixel voltages to a second set of sub-pixel regions in the first pixel repetition unit at a second side of the first gate line; and applying third pixel voltages to a first set of sub-pixel regions in the second pixel repetition unit at the first side of the first gate line, and applying fourth pixel voltages to a second set of sub-pixel regions in the second pixel repetition unit at the second side of the first gate line, where an electric field generated by the first pixel voltages is capable of driving liquid crystal molecules to be deflected, an electric field generated by the second pixel voltages is incapable of driving liquid crystal molecules to be deflected, the first pixel voltages include first voltages having a first polarity and second voltages having a second polarity, the quantity of the first voltages is N, and the quantity of the second voltages is M; and an electric field generated by the third pixel voltages is incapable of driving the liquid crystal molecules to be deflected, an electric field generated by the fourth pixel voltages is capable of driving the liquid crystal molecules to be deflected, the fourth pixel voltages include third voltages having a first polarity and fourth voltages having a second polarity, the quantity of the third voltages is P, the quantity of the fourth voltages is Q, an absolute value of each of the first pixel voltages is the same as an absolute value of each of the third pixel voltages, N+P=M+Q, and N, M, P and Q are each a positive integer.

BRIEF DESCRIPTION OF THE DRAWINGS

FIG. 4 is a schematic view showing the display substrate according to some other embodiments of the present disclosure;

FIG. 5A is a schematic view showing a distribution of region pairs in the display substrate according to some embodiments of the present disclosure;

FIG. 5B is a schematic view showing a first pixel repetition unit and a second pixel repetition unit in FIG. 5A;

FIG. 5C is a schematic view showing the first pixel repetition unit and the second pixel repetition unit in FIG. 5B;

FIG. 5D is a schematic view showing the distribution of the region pairs in the display substrate according to some embodiments of the present disclosure;

FIG. 5E is a schematic view showing the display substrate according to some other embodiments of the present disclosure;

DETAILED DESCRIPTION

In the related art, pixels are designed as a 1-Gate-Line-and-2-Data-Lines (1G2D) structure, i.e., one gate line is arranged between two adjacent rows of pixels, two data lines are arranged between two adjacent columns of pixels, the pixels in a same row of sub-pixel regions are connected to a same gate line, and the pixels in different rows are connected to different gate lines. Among the two adjacent rows of pixels, pixels in a same column are connected to different data lines. In this way, TFTs in two adjacent rows of pixels are controlled through two gate lines, and the two adjacent rows of pixels are charged through different data lines, so a charge time may be doubled so as to get a voltage driving liquid crystal molecules to be deflected. Although a same control sequence is applied to two adjacent gate lines, the two adjacent gate lines are independent. Due to a space occupied by the gate lines, an area of a pixel opening region is reduced, and thereby an aperture ratio reduces. In addition, due to a relatively large number of gate lines, a large number of gate driving chips need to be provided, so the manufacture cost may increase and it is adverse to an implementation of a narrow-bezel of a product.

Figure 1:
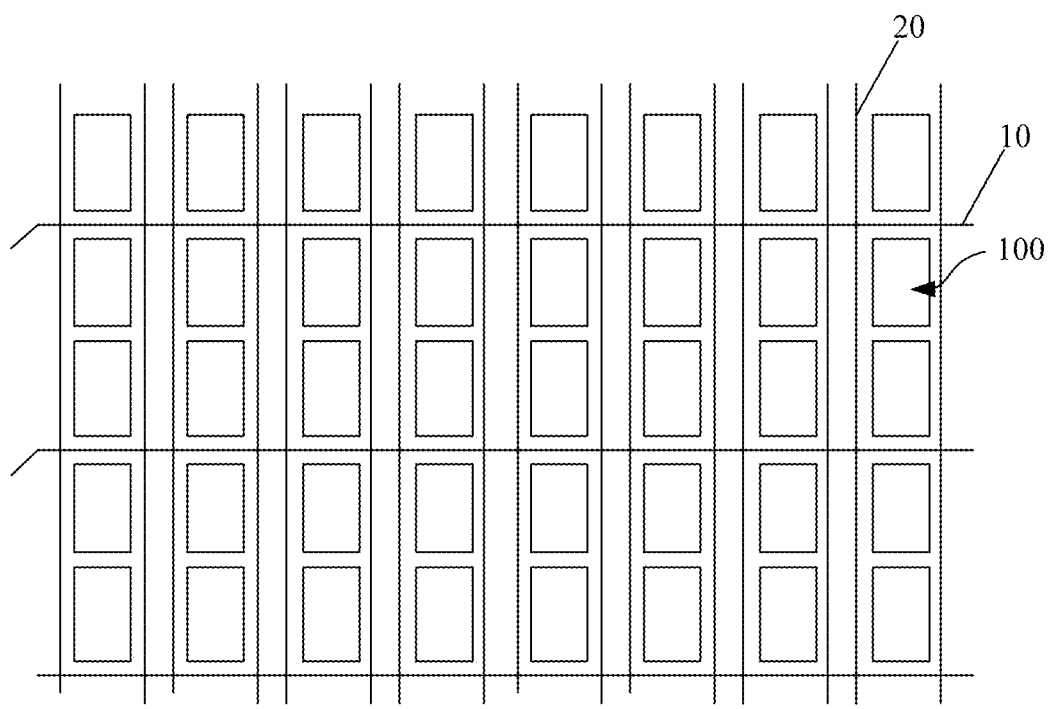
FIG. 1 is a schematic view showing a display substrate according to some embodiments of the present disclosure.
Figure 2A:
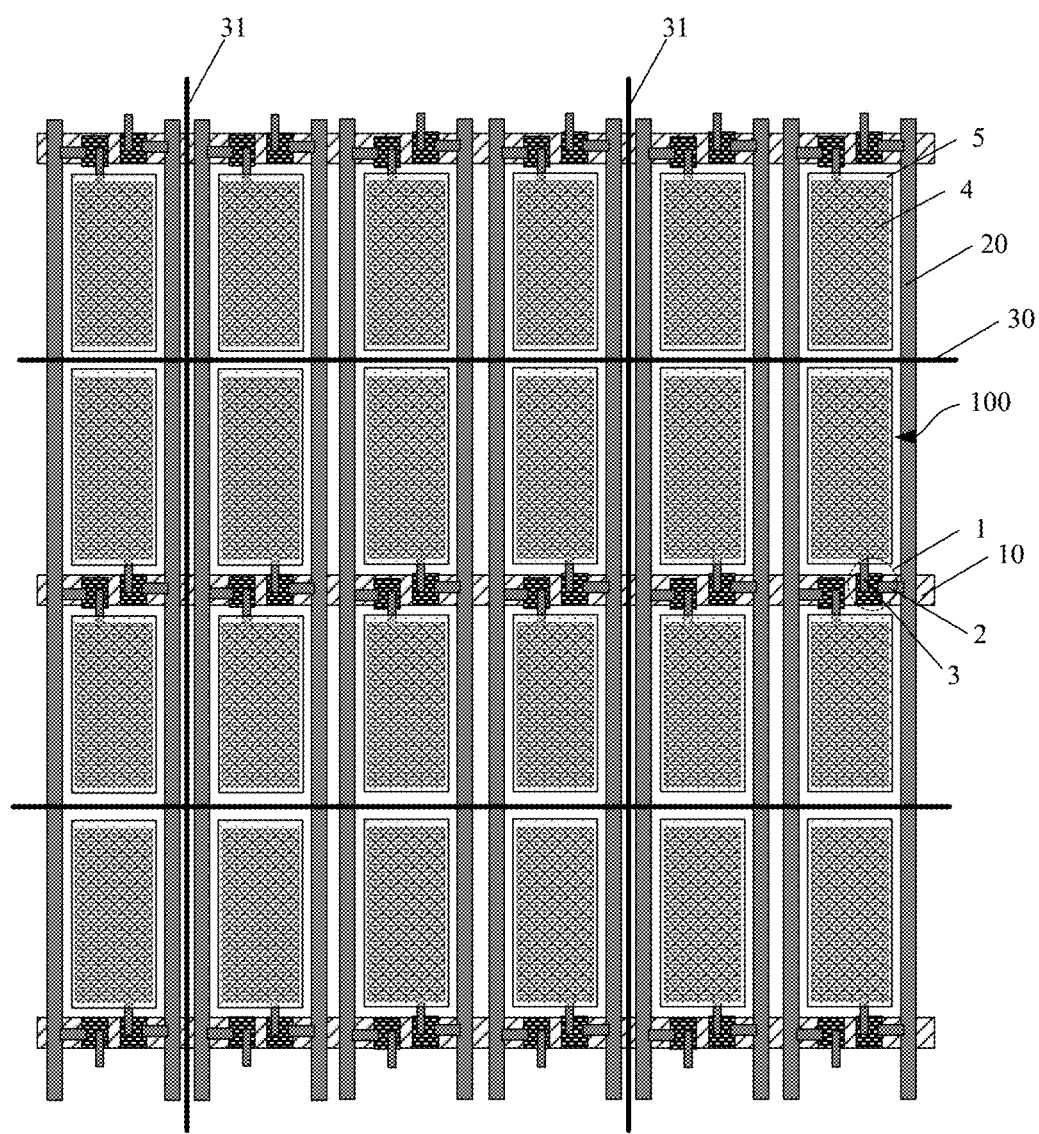
FIG. 2A is a schematic view showing the display substrate according to some other embodiments of the present disclosure.
Figure 2B:
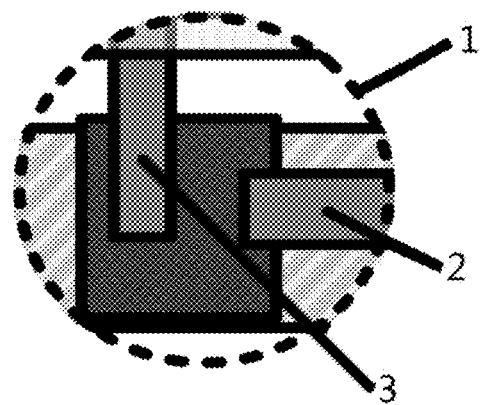
FIG. 2B is a topical schematic view showing the display substrate in FIG. 2A.

Some embodiments provide a display substrate which, as shown in FIGS. 1, 2A and 2B, includes a plurality of gate lines 10 and a plurality of data lines 20. The plurality of gate lines 10 crosses the plurality of data lines 20 to define a plurality of sub-pixel regions 100. Two rows of sub-pixel regions 100 are arranged between two adjacent gate lines 10, and two of the data lines 20 are arranged between two adjacent columns of sub-pixel regions 100. Each sub-pixel region 100 includes a TFT 1. A gate electrode of the TFT 1 is formed integrally with a corresponding gate line 10, a source electrode 2 of the TFT 1 is connected to a corresponding data line 20, and the TFT 1 is turned on or off through a gate line 10 connected to the gate electrode of the TFT 1.

TFTs 1 in two adjacent rows of sub-pixel regions 100 at two sides of one gate line of the plurality of gate lines 10 are connected to the gate line and connected to the data lines 20 respectively. In this way, TFTs in the two adjacent rows of sub-pixel regions are turned on through one gate line 10, a pixel voltage applied to data line 20 may be applied to source electrode 2 of each TFT 1.

According to above embodiments of the present disclosure, two rows of sub-pixel regions are arranged between two adjacent gate lines, and the two adjacent rows of sub-pixel regions at two sides of one gate line both connected the gate line, to reduce the number of the gate lines by half, increase an area of a pixel opening region, and increase an aperture ratio. When the number of the gate lines is reduced by half, it is able to reduce the number of gate driving chips or gate driving circuits, reduce a manufacture cost and provide a product with a narrow-bezel. In addition, a charge time for each row of sub-pixel regions is doubled, so it is able to provide a sufficient charge time, thereby to improve a pixel charge rate as well as a display effect.

In some embodiments of the present disclosure, the display substrate is an array substrate of a liquid crystal display device. In some embodiments of the present disclosure, the display substrate is a display substrate of an organic light-emitting diode (OLED) display device. In some embodiments of the present disclosure, the display substrate is a display substrate of a display device where a TFT serves as a driving element.

In above embodiments of the present disclosure, an angle between an extension direction of each gate line and an extension direction of each data line is substantially greater than zero. In some embodiments, the sub-pixel regions in a same row are arranged parallel to the gate line, and the sub-pixel regions in a same column are arranged parallel to the data line. In some embodiments of the present disclosure, the sub-pixel regions in a same row are arranged along a straight or folded line, and the sub-pixel regions in a same column are arranged along a straight or folded line.

In embodiments of the present disclosure, TFT is connected to a gate line, which indicates that a gate electrode of the TFT is connected to the gate line. The TFT is connected to a data line, which indicates that a source electrode of the TFT is connected to the data line.

In some embodiments, in order to enable the TFTs 1 in the two adjacent rows of sub-pixel regions to be connected to the data lines 20 respectively, two data lines 20 is arranged between two adjacent columns of sub-pixel regions, i.e., the number of the data lines 20 is equal to the number of the sub-pixel regions in a row. For example, in two adjacent sub-pixel regions 100 in a same column, one TFT 1 in a first sub-pixel region 100 of the two adjacent sub-pixel regions 100 in a same column is connected to a data line 20 at a first side of the column of the two adjacent sub-pixel regions, and the other TFT 1 in a second sub-pixel region 100 of the two adjacent sub-pixel regions 100 in a same column is connected to the data line 20 at a second side of the column of sub-pixel regions.

In some embodiments of the present disclosure, the display substrate includes the gate lines 10, the data lines 20, and common electrode lines arranged at a display region and configured to apply a reference voltage.

In some embodiments of the present disclosure, as shown in FIGS. 2A, 2B, 2C and 3, the common electrode lines include a plurality of first common electrode lines 30 and a plurality of second common electrode lines 31. The first common electrode lines 30 are arranged parallel to the gate lines 10, each of the plurality of first common electrode lines 30 is arranged between two adjacent rows of sub-pixel regions 100, and the two adjacent rows of sub-pixel regions 100 are located between two adjacent gate lines 10. Because no gate line is arranged between the two rows of sub-pixel regions and the first common electrode line 30 is arranged between the two rows of sub-pixel regions 100, it is able to prevent the pixel opening region from being occupied, thereby to increase the aperture ratio.

In some embodiments of the present disclosure, the second common electrode lines 31 are arranged parallel to, or substantially parallel to, the data lines 20, and the second common electrode lines 31 is arranged between two adjacent columns of sub-pixel regions 100. For example, an absolute value of an angle between the second common electrode line 31 and the line 20 ranges from 0° to 5°. An acute angle between the second common electrode line 31 and the data line 20 in a counterclockwise direction is defined as a positive angle, and an acute angle between each second common electrode line 31 and the corresponding data line 20 in a clockwise direction is defined as a negative angle.

The first common electrode line 30 crosses the second common electrode line 31, to improve the uniformity of a resistance of each common electrode line. During displaying an image, a coupling capacitance may be formed between the common electrode line and any of the gate lines, the data lines and for-display electrodes (also called display electrodes). When signals applied to the gate lines, the data lines and the display electrodes changes, a signal applied to the common electrode line may change too. During a recovery process of a signal applied to the common electrode line, the better the uniformity of the resistance of the common electrode line, the larger the recovery rate and the more stable of the signal applied to the common electrode line.

In some embodiments of the present disclosure, the first common electrode lines 30 and the gate lines 10 are arranged in a same layer, and made of a same gate metal layer. In some embodiments of the present disclosure, the second common electrode lines 31 and the data lines 20 are arranged in a same layer and made of a same source/drain metal layer. An insulation layer 32 is arranged between the first common electrode lines 30 and the second common electrode lines 31.

In some embodiments of the present disclosure, the insulation layer is provided with a plurality of via-holes 33 each at a position where the orthogonal projection of the first common electrode line 30 onto the display region crosses the orthogonal projection of the corresponding second common electrode 31 onto the display region. The first common electrode lines 30 are electrically connected to the second common electrode lines 31 through the via-holes 33, improving the uniformity of the resistance of the common electrode lines.

In some embodiments of the present disclosure, the display substrate includes one of the first common electrode line 30 and the second common electrode line 31.

In some embodiments of the present disclosure, the display substrate includes the second common electrode lines 31, these second common electrode lines 31 are spaced apart from each other at an equal distance, improving the uniformity of the resistance of the common electrode lines. For example, the number of the sub-pixel regions 100 between any two adjacent second common electrode lines 31 is s, where s is a positive integer.

Figure 2C:
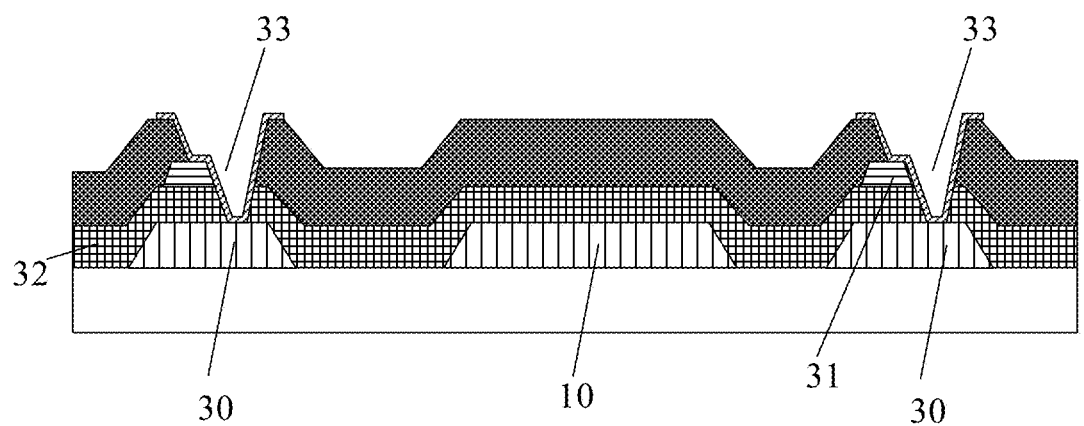
FIG. 2C is a sectional view of the display substrate in FIG. 2A.
Figure 3:
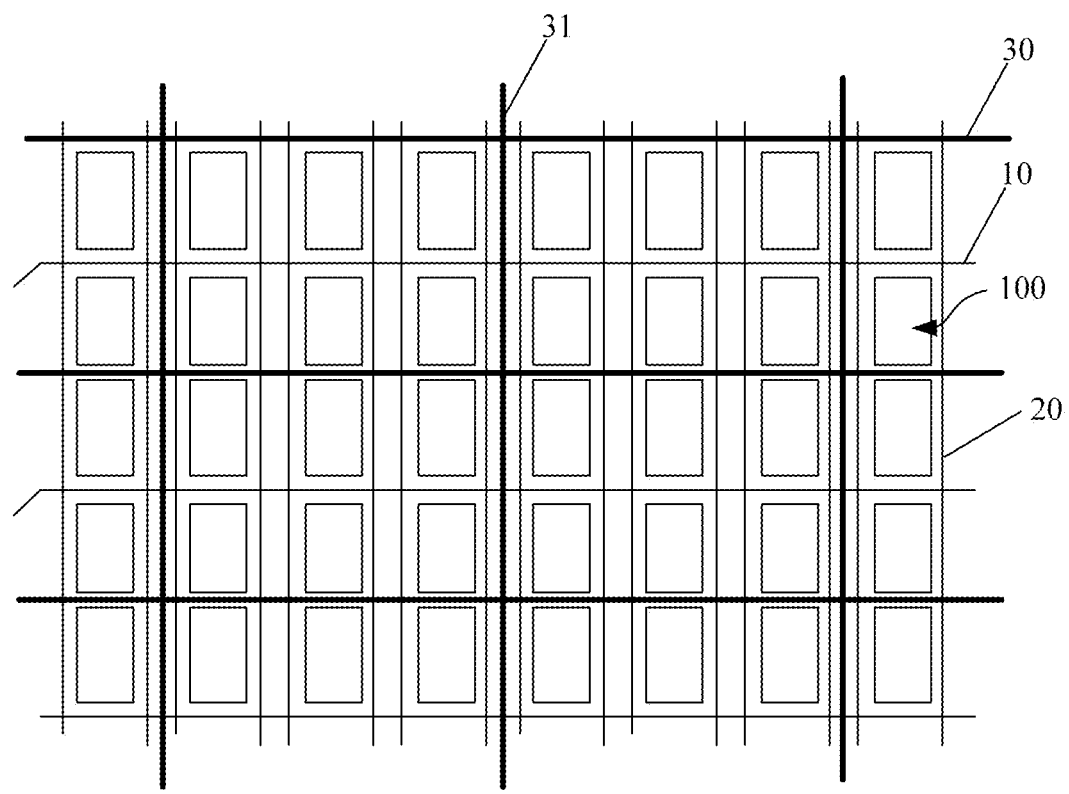
FIG. 3 is a schematic view showing the display substrate according to some other embodiments of the present disclosure.

In some embodiments of the present disclosure, as shown in FIGS. 2A, 2B and 2C, the display substrate is an array substrate of the liquid crystal display device, the display substrate includes the plurality of gate lines 10 arranged parallel to each other, the plurality of data lines 20 arranged parallel to each other, the plurality of sub-pixel regions 100, the plurality of first common electrode lines 30, and the plurality of second common electrode lines 31.

The display substrate further includes the insulation layer arranged between the first common electrode lines 30 and the second common electrode lines 31.

The orthogonal projections of the gate lines 10 onto the display region crosses the orthogonal projections of the data lines 20 onto the display region, to define the plurality of sub-pixel regions 100. Two rows of sub-pixel regions are arranged between two adjacent gate liens 10, and two of the plurality of data lines 20 are arranged between two adjacent columns of sub-pixel regions.

Each first common electrode line 30 is arranged parallel to the gate lines 10, and arranged between two rows of sub-pixel regions located between two gate lines 10. Each second common electrode line 31 is arranged parallel to the data lines 20, and arranged between two columns of sub-pixel regions 100.

The insulation layer is provided with the via-hole 33 at a position where the orthogonal projection of each first common electrode line 30 onto the display region and the orthogonal projection of the corresponding second common electrode line 31 onto the display region, and the first common electrode line 30 is electrically connected to the second common electrode line 31 through the via-hole 33.

Each sub-pixel region 100 includes the TFT 1 and a pixel electrode 4. The display substrate further includes a passivation layer arranged between the TFT 1 and the pixel electrode 4.

The gate electrodes of the TFTs 1 in the two adjacent sub-pixel regions at two sides of one gate line of the gate lines 10 are connected to the gate line 10. In the two adjacent sub-pixel regions in a same column, the source electrode 2 of the TFT 1 in a first sub-pixel region 100 is connected to the data line 20 at a first side of the column of sub-pixel regions, and the source electrode 2 of the TFT 1 in a second sub-pixel region 100 is connected to the data line 20 at a second side of the column of sub-pixel regions. The pixel electrode 4 is connected to a drain electrode 3 of the TFT 1 in each sub-pixel region.

Based on the above, in a liquid crystal display device with a transverse electric field, each sub-pixel region 100 of the array substrate further includes a common electrode 5 connected to the common electrode line, and an intermediate insulation layer arranged between the pixel electrode 4 and the common electrode 5.

In some embodiments of the present disclosure, each TFT 1 is a top-gate TFT or a bottom-gate TFT.

In some embodiments of the present disclosure, as shown in FIG. 4, the display substrate is divided into a first region 40 and a second region 50 at a middle position 11 along a direction parallel to the data lines 20. The number of the sub-pixel regions in the first region 40 is the same as the number of the sub-pixel regions in the second region 50, and an arrangement of the sub-pixel regions in the first region 40 is the same as an arrangement of the sub-pixel regions in the second region 50.

Referring to FIG. 4, two data lines 20 (i.e., a first data line 201 and a second data line 202) are arranged between two adjacent columns of sub-pixel regions at the middle position 11. The first data line 201 connects to a first TFT, and the second data line 202 connects to a second TFT. A sub-pixel region where the first TFT is located and a sub-pixel region where the second TFT is located are arranged in adjacent rows of sub-pixel regions and in adjacent columns of sub-pixel regions. The sub-pixel region where the first TFT is located and the sub-pixel region where the second TFT is located are arranged at a first side of one of the plurality of gate lines and a second side of the one of the plurality of gate lines respectively.

Referring to FIG. 4 again, in any of the first region and the second region of the display substrate, two data lines 20 (i.e., a third data line 203 and a fourth data line 204) are arranged between two adjacent columns of sub-pixel regions. The third data line 203 connects to a third TFT, and the fourth data line 204 connects to a fourth TFT. A sub-pixel region where the third TFT is located and a sub-pixel region where the fourth TFT is located are arranged in a same row of sub-pixel regions and in adjacent columns of sub-pixel regions. The sub-pixel region where the third TFT is located and the sub-pixel region where the fourth TFT is located are arranged at a first side of one of the plurality of gate lines and a second side of the one of the plurality of gate lines respectively. In any of the first region and the second region of the display substrate, an edge TFT is connected to an edge data line arranged at an edge of the display substrate, an adjacent TFT is connected to a data line adjacent to the edge data line, the edge TFT and the adjacent TFT are connected to a same gate line, and a sub-pixel region where the edge TFT is located and a sub-pixel region where the adjacent TFT is located are in a same column of sub-pixel regions and in adjacent rows of sub-pixel regions.

In some embodiments of the present disclosure, as shown in FIG. 5A, the display substrate is divided into a plurality of region pairs ab, each region pair ab include a first pixel repetition unit a and a second pixel repetition unit b adjacent to each other in a direction parallel to the plurality of gate lines. As shown in FIGS. 5B and 5C, the first pixel repetition unit a includes two sets of sub-pixel regions adjacent to each other in a direction parallel to the plurality of data lines 20, and each set of sub-pixel regions include sub-pixel regions where sub-pixels of a plurality of colors (e.g., red (R), green (G) and blue (B) in FIG. 5B) and in a same row which is parallel to the plurality of gate lines are located. One of the plurality of gate lines 10 is arranged between the two sets of sub-pixel regions. The number of sub-pixel regions in the second pixel repetition unit b is the same as the number of sub-pixel regions in the first pixel repetition unit a, and an arrangement of the sub-pixel regions in the second pixel repetition unit b is the same as an arrangement of the sub-pixel regions in the first pixel repetition unit a. Two data lines (i.e., a fifth data line 205 and a sixth data line 206) are arranged between the first pixel repetition unit a and the second pixel repetition unit b. The fifth data line 205 connects to a fifth TFT of the first pixel repetition unit a, and the sixth data line 206 connects to a sixth TFT of the second pixel repetition unit b. A sub-pixel region where the fifth TFT is located and a sub-pixel region where the sixth TFT is located are arranged in a row of sub-pixel regions and in adjacent columns of sub-pixel regions. The sub-pixel region where the fifth TFT is located and a sub-pixel region where the sixth TFT is located are arranged at a first side of one of the plurality of gate lines and a second side of the one of the plurality of gate lines respectively.

Referring to FIG. 5C again, in any of the first pixel repetition units a and the second pixel repetition units b, two data lines (i.e., a seventh data line 207 and an eighth data line 208) are arranged between two adjacent columns of sub-pixel regions. The seventh data line 207 is connected to a seventh TFT, and the eighth data line 208 is connected to an eighth TFT. A sub-pixel region where the seventh TFT is located and a sub-pixel region where the eighth TFT is located are arranged in a same row of sub-pixel regions and in adjacent columns of sub-pixel regions. The sub-pixel region where the seventh TFT is located and the sub-pixel region where the eighth TFT is located are arranged at a first side of one of the plurality of gate lines and a second side of the one of the plurality of gate lines respectively. In any of the first pixel repetition units a and the second pixel repetition units b, an edge TFT is connected to an edge data line arranged at an edge of the display substrate, an adjacent TFT is connected to a data line adjacent to the edge data line, the edge TFT and the adjacent TFT are connected to a same gate line, and a sub-pixel region where the edge TFT is located and a sub-pixel region where the adjacent TFT is located are in a same column of sub-pixel regions and in adjacent rows of sub-pixel regions.

In some embodiments of the present disclosure, as shown in FIG. 5D, a marshalling sequence of the first pixel repetition unit and the second pixel repetition unit b in each region pair is ba.

In some embodiments of the present disclosure, as shown in FIG. 5E, two data lines 20 (i.e., a ninth data line 209 and a tenth data line 2010) are arranged between two adjacent columns of sub-pixel regions of the display substrate. The ninth data line 209 connects to a ninth TFT, and the tenth data line 2010 connects to a tenth TFT. A sub-pixel region where the ninth TFT is located and a sub-pixel region where the tenth TFT is located are arranged in adjacent rows of sub-pixel regions and in adjacent columns of sub-pixel regions. The sub-pixel region where the ninth TFT is located and the sub-pixel region where the tenth TFT is located are arranged at a first side of one of the plurality of gate lines and a second side of the one of the plurality of gate lines respectively. An edge TFT is connected to an edge data line arranged at an edge of the display substrate, an adjacent TFT is connected to a data line adjacent to the edge data line, the edge TFT and the adjacent TFT are connected to a same gate line, and a sub-pixel region where the edge TFT is located and a sub-pixel region where the adjacent TFT is located are in a same column of sub-pixel regions and in adjacent rows of sub-pixel regions.

The present disclosure further provides a display device and a driving method thereof in following embodiments, and the display device includes the above display substrate. Because the number of the gate lines is reduced by half, it is able to improve an aperture ratio. When the number of the gate lines is reduced by half, it is able to reduce the number of gate driving chips or gate driving circuits, thereby to reduce the manufacture cost and provide a product with a narrow-bezel. The TFTs in the two adjacent rows of sub-pixel regions at two sides of each gate line are turned on simultaneously through one gate line, so it is able to provide a sufficient charge time, thereby to improve a pixel charge rate as well as a display effect.

In some embodiments of the present disclosure, the display device is a liquid crystal display device or an OLED display device.

The driving method includes turning on the TFTs in two adjacent rows of sub-pixel regions at two sides of one gate line simultaneously through the gate line, and applying a pixel voltage applied to a data line to each TFT connected to the data line and in the two adjacent rows of sub-pixel regions.

According to the driving method in above embodiments of the present disclosure, the TFTs in the two adjacent rows of sub-pixel regions at the two sides of each gate line are turned on simultaneously through one gate line, so it is able to double the charge time for each sub-pixel region and provide a sufficient charge time, thereby to improve the pixel charge rate for each sub-pixel region as well as the display effect.

In some embodiments of the present disclosure, the display devices include gate lines, data lines, display electrodes and common electrode lines. Each display electrode is connected to a drain electrode of a corresponding TFT, and a pixel voltage applied to each data line is applied to the display electrode through the corresponding TFT, so as to form a driving electric field for display. For example, in the liquid crystal display device, the display electrode is a pixel electrode; and in the OLED display device, the display electrode is an anode of an OLED.

Each common electrode line is configured to provide a reference voltage. For example, each common electrode is configured to apply a reference voltage to a common electrode of the liquid crystal display device, or to a cathode of the OLED of the OLED display device.

In some embodiments of the present disclosure, the common electrode lines include a plurality of first common electrode lines arranged parallel to the gate lines. The first common electrode lines and the gate lines are arranged in a same layer, and the first common electrode line is arranged between two rows of sub-pixel regions which are located between two adjacent gate lines, so it is able to prevent the first common electrode line from occupying the pixel opening region.

During displaying an image, a coupling capacitance may be generated between the common electrode line and each of the gate lines, the data lines and the display electrodes. When a signal applied to each of the gate lines, the data lines and the display electrodes changes, a signal applied to the corresponding common electrode line may change too. For example, when an image is being displayed and the signals applied to the display electrodes for a red sub-pixel and a blue sub-pixel have positive polarities, the signal applied to the corresponding common electrode lines may be pulled toward a positive polarity (e.g., when a signal initially applied to the common electrode line is 0 and pulled toward a positive polarity, the signal has a value greater than 0), and when a signal applied to the display electrode for a green sub-pixel has a negative polarity, the signal applied to the corresponding common electrode line may be pulled toward a negative polarity (e.g., when the signal initially applied to the common electrode line is 0 and pulled toward a negative polarity, the signal may has a value smaller 0). Hence, most signals applied to the common electrode lines corresponding to the display electrodes for the sub-pixels of an entire display panel may be pulled toward a positive polarity, and compared with the reference voltage, the signals applied to the common electrode lines may be relatively large positive voltages. At this time, due to the insufficient stability of the signals applied to the common electrode lines, a driving voltage for the green sub-pixels may increase while driving voltages for the red and blue sub-pixels may decrease, so such a phenomenon as greenish may occur.

For example, the following two methods may be adopted to improve the stability of the signals applied to the common electrode lines.

In a first method, the coupling capacitance is reduced, to improve the stability of the signals applied to the common electrode lines.

In a second method, when an image is being displayed, for the signal applied to the common electrode line, a balance is made between the signal which has been pulled toward a positive polarity and the signal which has been pulled toward a negative polarity, so as to maintain the signals applied to the common electrode lines as the reference voltage.

When the first method is adopted, it is necessary to increase a distance between the common electrode line and each of the gate lines, the data lines and the display electrodes, which reduces resolution of the display panel.

In some embodiments of the present disclosure, when the second method is adopted and an image is being displayed, a display device includes a display substrate, and the display substrate includes a plurality of first sub-pixel regions and the other sub-pixel regions. The pixel voltages are applied to the plurality of first sub-pixel regions to generate an electric field capable of driving the liquid crystal molecules to be deflected, and the pixel voltages are applied to the other sub-pixel regions to generate an electric field incapable of driving the liquid crystal molecules to be deflected. For example, for the display device in a normally dark mode, the first sub-pixel regions displays a grayscale 255, and the other sub-pixel regions displays a grayscale 0. Each of the plurality of first sub-pixel regions consists of first sub-pixels and second sub-pixels.

In the embodiments of the present disclosure, when an image is being displayed, among the pixel voltages applied to the plurality of first sub-pixel regions, the number of the pixel voltages having a first polarity is the same as the number of the pixel voltages having a second polarity opposite to the first polarity, and an absolute value of each pixel voltage having the first polarity is the same as an absolute value of each pixel voltage having the second polarity. The pixel voltage having the first polarity (or the second polarity) is applied to each sub-pixel region in the first sub-pixel regions, so as to lead absolute values of signals pulling a common electrode signal toward the positive polarity being equal to absolute values of signals pulling a common electrode signal toward the negative polarity, thereby to maintain the signal applied to the common electrode line as the reference voltage.

In the embodiments of the present disclosure, a row of sub-pixel regions is arranged between one gate line and one common electrode line, so the influence of the gate line on the signal applied to the common electrode line may be omitted.

In some embodiments of the present disclosure, when the second method is adopted, FIG. 4 shows the structure of the display substrate involved in a display device.

When the display device is in the normally dark mode and an image is being displayed, the number of bright-state sub-pixel regions in the first region is the same as the number of bright-state sub-pixel regions in the second region (in each bright-state sub-pixel region, the pixel voltage is applied to a sub-pixel to form an electric field capable of driving the liquid crystal molecules to be deflected), and the number of dart-state sub-pixel regions in the first region is the same as the number of dark-state sub-pixel regions in the second region (in each dark-state sub-pixel region, a pixel voltage is applied to a sub-pixel to form an electric field incapable of driving the liquid crystal molecules to be deflected). The first pixel region includes the bright-state sub-pixel regions in the first region, and the second sub-pixel region includes the bright-state sub-pixel regions in the second region. A first group of pixel voltages is applied to the first pixel region, and one pixel voltage in the first group of pixel voltages is applied to one sub-pixel region in the first pixel region. A second group of pixel voltages is applied to the second pixel region, and one pixel voltage in the second group of pixel voltages is applied to one sub-pixel region in the second pixel region.

The first group of pixel voltages included n first pixel voltages having the first polarity and m second pixel voltages having the second polarity, and the second group of pixel voltages includes p third pixel voltages having the first polarity and q fourth pixel voltages having the second polarity, where n=q, m=p, (n+p)=(m+q), and n, m, p and q are each a positive integer. The first pixel region and the second pixel region are both bright-state pixel regions. Absolute values of pixel voltages in the first group of pixel voltages and the second group of pixel voltages are of a same value.

According to embodiments of the present disclosure, when an image is being displayed, pixel voltages applied to all the bright-state sub-pixel regions (for generating an electric field capable of driving the liquid crystal molecules to be deflected), the number of pixel voltages having the first polarity is the same as the number of pixel voltages having the second polarity, and absolute values of all of the pixel voltages are the same. As a result, it is able to make absolute values of signals pulling a common electrode signal toward the positive polarity being equal to absolute values of signals pulling a common electrode signal toward the negative polarity, thereby to maintain the signal applied to the common electrode line as the reference voltage. The liquid crystal molecules in the dark-state sub-pixel regions of the display device are not deflected.

A driving method will be described hereinafter when each pixel region of the display device includes a red sub-pixel region, a green sub-pixel region and a blue sub-pixel region.

Figure 6A:
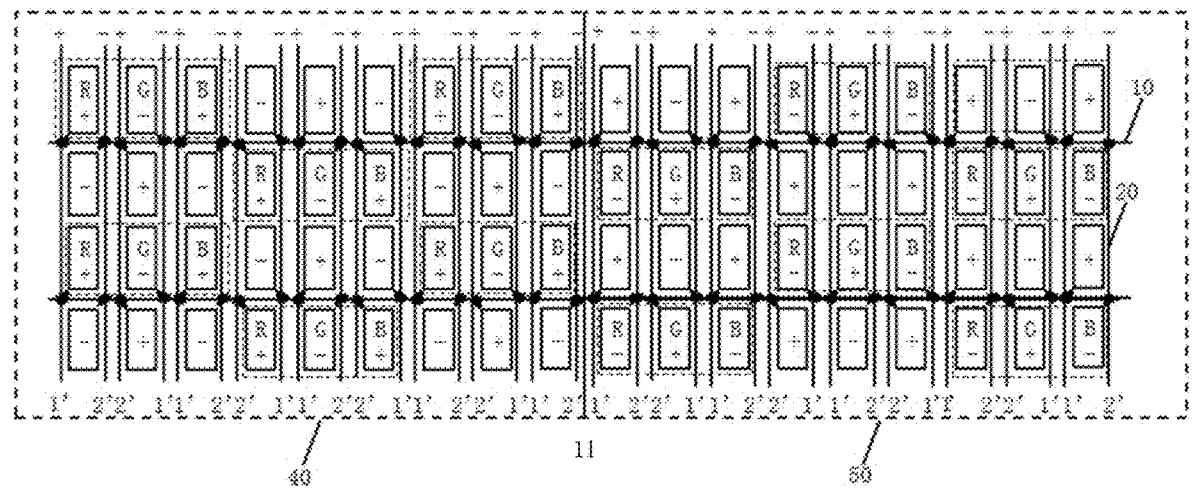
FIG. 6A is a schematic view showing a distribution of polarities of pixel voltages applied to all sub-pixel regions when an image is being displayed according to some embodiments of the present disclosure.
Figure 6B:
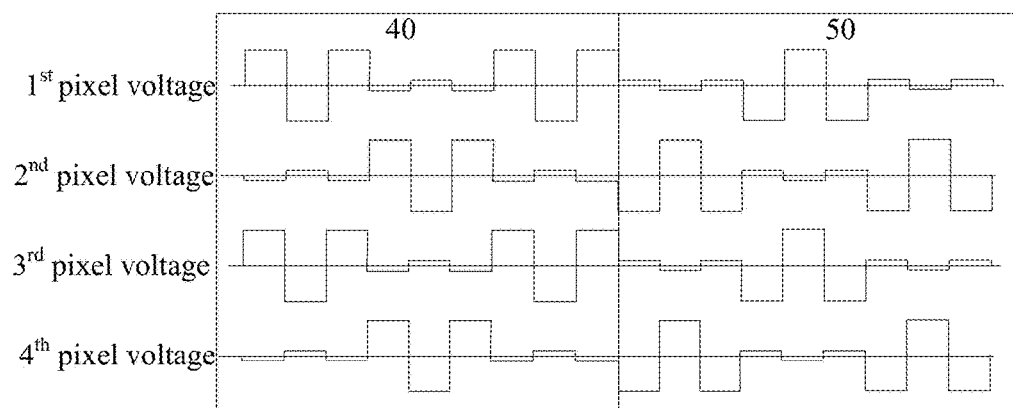
FIG. 6B is a schematic view showing pixel voltages applied to all sub-pixel regions when an image is being displayed according to some embodiments of the present disclosure.

FIG. 6A shows a distribution of the polarities of the pixel voltages applied to all the sub-pixel regions when an image is being displayed, and FIG. 6B shows the pixel voltages applied to all the sub-pixel regions when an image is being displayed. A voltage applied to a pixel in an $i^{th}$ row and a $j^{th}$ column in FIG. 6A (starting from a left side) is a $j^{th}$ pulse of the pixel voltages applied to the pixels in the $i^{th}$ row of sub-pixel regions in FIG. 6B. As shown in FIG. 6B, $1^{st}$ pixel voltage is a pixel voltage applied to the pixels in the $1^{st}$ row of sub-pixel regions, $2^{nd}$ pixel voltage is a pixel voltage applied to the pixels in the $2^{nd}$ row of sub-pixel regions, 3rd pixel voltage is a pixel voltage applied to the pixels in the $3^{rd}$ row of sub-pixel regions, and $4^{th}$ pixel voltage is a pixel voltage applied to the pixels in the $4^{th}$ row of sub-pixel regions. As shown in FIGS. 6A and 6B, when an image is being displayed, a first group of pixel voltages are applied to the first pixel region (indicated by a dotted box in the first region 40), the first group of pixel voltages includes red sub-pixel voltages having a positive polarity and applied to the red sub-pixel regions, green sub-pixel voltages having a negative polarity and applied to the green sub-pixel regions, and blue sub-pixel voltages having a positive polarity and applied to the blue sub-pixel regions. A second group of pixel voltages are applied to the second pixel region (indicated by a dotted box in the first region 50), and the second group of pixel voltages include red sub-pixel voltages having a negative polarity, green sub-pixel voltages having a positive polarity and blue sub-pixel voltages having a negative polarity. Absolute values of the red sub-pixel voltages, green sub-pixel voltages and blue sub-pixel voltages are the same.

Based on the display substrate in FIG. 4, as shown in FIGS. 6A and 6B, a connection relationship between the data lines and the sub-pixel regions in the first region 40 may be expressed as 1'2'2'1'1'2'2'1'1'2'2'1'1'2'2'1'1'2' (where "1'" represents that the a data line is connected to the pixels in a first row (i.e., a row of pixels at a first side of a gate line), and "2'" represents that the a data line is connected to the pixels in a second row (i.e., a row of pixels at a second side of the gate line)), and a connection relationship between the data lines and the sub-pixel regions in the second region 50 may also be expressed as 1'2'2' 1'1'2'2' 1'1'2'2' 1'1'2'2' 1'1'2'. The sub-pixels with "+" or "−" are in a dark state (the pixel voltages are applied to the dark-state sub-pixels to form an electric field incapable of driving the liquid crystal molecules to be deflected), and the sub-pixels with R (or G or B) are in a bright state (the pixel voltages applied to the bright-state sub-pixels to form an electric field capable of driving the liquid crystal molecules to be deflected). For each bright-state sub-pixel, "+" represents a positive polarity, and the pixel voltage applied to the bright-state sub-pixel is capable of pulling a common electrode signal toward the positive polarity. For each dark-state sub-pixel, "−" represents a negative polarity, and the pixel voltage applied to the dark-state sub-pixel is capable of pulling the common electrode signal toward the negative polarity. For the display substrate in FIG. 6A, the first region consists of 12 bright-state sub-pixels having the positive polarity (+) and 6 bright-state sub-pixels having the negative polarity (−), and the second region consists of 12 bright-state sub-pixels having the negative polarity (−) and 6 bright-state sub-pixels having the positive polarity (+). For the display substrate, the number of the bright-state sub-pixels having the positive polarity is the same as the number of the dark-state sub-pixels having the negative polarity, so it is able to make absolute values of signals pulling a common electrode signal toward the positive polarity being equal to absolute values of signals pulling a common electrode signal toward the negative polarity, thereby to maintain the signal applied to the common electrode line as the reference voltage, and prevent the occurrence of such a phenomenon as greenish, flick and afterimages.

In some embodiments of the present disclosure, as shown in FIGS. 5A-5D and 7, for the display device in the normally dark mode, when an image is being displayed, the display region of the display device is divided into a plurality of first pixel repetition units a and a plurality of second pixel repetition units b, and the number of the first pixel repetition units a is the same as the number of the second pixel repetition units b. Each of the first pixel repetition units a and the second pixel repetition unit b includes a plurality of sub-pixel regions. The number of the pixel voltages applied to the bright-state sub-pixels having the positive polarity (+) in each first pixel repetition unit a is the same as the number of the pixel voltages applied to the bright-state sub-pixels having the negative polarity (−) in each second pixel repetition unit b, the number of the pixel voltages applied to the bright-state sub-pixels having the negative polarity in each first pixel repetition unit a is the same as the number of the pixel voltages applied to the bright-state sub-pixels having the positive polarity in each second pixel repetition unit b, and absolute values of pixel voltages applied to the bright-state sub-pixel are the same, to maintain the signal applied to the common electrode line as the reference voltage.

Figure 7:
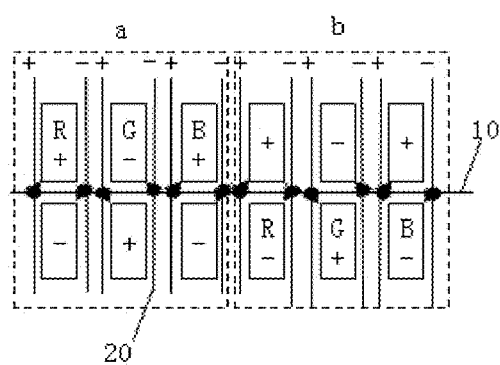
FIG. 7 is a schematic view showing the distribution of polarities of pixel voltages applied to the first pixel repetition unit and the second pixel repetition unit when an image is being displayed according to some embodiments of the present disclosure.

For each row of pixel regions, the number of the first pixel repetition units a is the same as the number of the second pixel repetition units b, and the first pixel repetition units a and the second pixel repetition units b are arranged alternately, to make absolute values of signals pulling a common electrode signal toward the positive polarity being equal to absolute values of signals pulling a common electrode signal toward the negative polarity In some embodiments of the present disclosure, as shown in FIG. 7, the sub-pixel regions where the bright-state sub-pixels having the positive polarity and the negative polarity are located are adopted to display a grayscale 255, and the sub-pixel regions where the dark-state sub-pixels in the first repetition units a and the second pixel repetition units b are located are adopted to display a grayscale 0.

Figure 8:
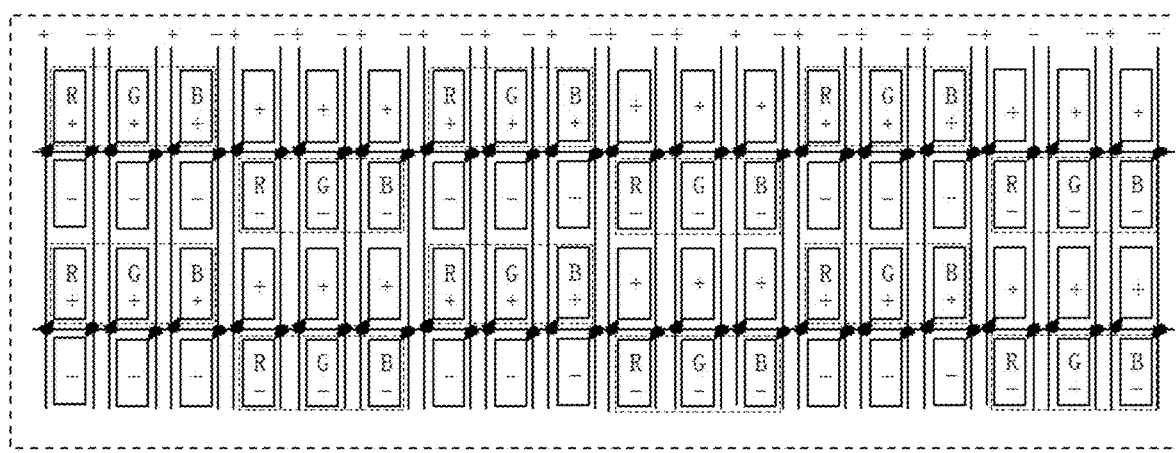
FIG. 8 is a schematic view showing the distribution of the polarities of the pixel voltages applied to pixel regions of a display substrate when an image is being displayed according to some embodiments of the present disclosure.

In some embodiments of the present disclosure, as shown in FIGS. 5E and 8, the voltages applied to the sub-pixels in each row have a same polarity. The sub-pixels in a first row include 9 bright-state sub-pixels having the positive polarity, and the sub-pixels in a second row includes 9 bright-state sub-pixels having the negative polarity. An absolute value of the positive voltage is the same as an absolute value of the negative voltage. For the sub-pixels in two adjacent rows in the display panel, the number of the bright-state sub-pixels having the positive polarity is the same as the number of the dark-state sub-pixels having the negative polarity. As a result, it is able to make absolute values of signals pulling a common electrode signal toward the positive polarity being equal to absolute values of signals pulling a common electrode signal toward the negative polarity, thereby to maintain the signal applied to the common electrode line as the reference voltage, and prevent the occurrence of such a phenomenon as greenish, flick and afterimages.

What is claimed is:

1. A display substrate, comprising a plurality of gate lines and a plurality of data lines,
    wherein the plurality of gate lines crosses the plurality of data lines to define a plurality of sub-pixel regions;
    each of the plurality of sub-pixel regions comprises one thin film transistor (TFT) connected to one of the plurality of data lines;
    two rows of sub-pixel regions are arranged between two adjacent gate lines;
    two data lines of the plurality of data lines are arranged between two adjacent columns of sub-pixel regions;
    TFTs in two adjacent rows of sub-pixel regions at two sides of one gate line of the plurality of gate lines are connected to the gate line and connected to different data lines;
    the display substrate further comprises:
    a first common electrode line arranged parallel to the plurality of gate lines and arranged between two rows of sub-pixel regions which are arranged between the two adjacent gate lines;
    a second common electrode line arranged parallel to the plurality of data lines and arranged between two adjacent columns of sub-pixel regions; and
    an insulation layer arranged between the first common electrode line and the second common electrode line, wherein the insulation layer is provided with a via-hole at a position where an orthogonal projection of the first common electrode line onto the insulation layer crosses an orthogonal projection of the second common electrode line onto the insulation layer, and the first common electrode line is electrically connected to the second common electrode line through the via-hole.

2. The display substrate according to claim 1, wherein the first common electrode line and the plurality of gate lines are arranged in a same layer.

3. The display substrate according to claim 2, wherein the second common electrode line and the plurality of data line are arranged in a same layer, and the first common electrode line crosses the second common electrode line.

4. The display substrate according to claim 1, further comprising at least one common electrode line arranged parallel to the plurality of data lines and arranged between two adjacent columns of sub-pixel regions.

5. The display substrate according to claim 4, comprising at least three common electrode lines, wherein the quantity of the sub-pixel regions between any two adjacent common electrode lines is s, and s is a positive integer.

6. The display substrate according to claim 4, comprising at least three common electrode lines, wherein any two adjacent common electrode lines are spaced apart from each other at an equal distance.

7. The display substrate according to claim 4, comprising at least three common electrode lines, wherein the quantity of sub-pixel regions in any row of sub-pixel regions and between any two adjacent common electrode lines is greater than or equal to 2.

8. The display substrate according to claim 4, wherein each of the at least one common electrode line is arranged between two data lines which are arranged between two adjacent columns of sub-pixel regions.

9. The display substrate according to claim 1, wherein a first data line and a second data line are arranged between the two adjacent columns of sub-pixel regions, the first data line is connected to a first TFT, the second data line is connected to a second TFT, a sub-pixel region where the first TFT is located and a sub-pixel region where the second TFT is located are arranged in adjacent rows of sub-pixel regions and in adjacent columns of sub-pixel regions, the sub-pixel region where the first TFT is located and the sub-pixel region where the second TFT is located are arranged at a first side of one of the plurality of gate lines and a second side of the one of the plurality of gate lines respectively; and
    a third TFT is connected to a third data line arranged at an edge of the display substrate, a fourth TFT is connected to a data line adjacent to the third data line, the third TFT and the fourth TFT are connected to a same gate line, and a sub-pixel region where the third TFT is located and a sub-pixel region where the fourth TFT is located are in a same column of sub-pixel regions and in adjacent rows of sub-pixel regions.

10. The display substrate according to claim 1, wherein the display substrate is divided into a first region and a second region in a direction parallel to the plurality of data lines, the quantity of the sub-pixel regions in the first region is the same as the quantity of sub-pixel regions in the second region, and an arrangement of the sub-pixel regions in the first region is the same as an arrangement of the sub-pixel regions in the second region;
  a first data line and a second data line are arranged between the first region and the second region, the first data line is connected to a first TFT in the first region, the second data line is connected to a second TFT in the second region, a sub-pixel region where the first TFT is located and a sub-pixel region where the second TFT is located are arranged in adjacent rows of sub-pixel regions and in adjacent columns of sub-pixel regions, and the sub-pixel region where the first TFT is located and the sub-pixel region where the second TFT is located are arranged at a first side of one of the plurality of gate lines and a second side of the one of the plurality of gate lines respectively; and
  in any of the first region and the second region, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, the sub-pixel region where the third TFT is located and the sub-pixel region where the fourth TFT is located are arranged at the first side and the second side respectively; and
  in any of the first region and the second region, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions.

11. The display substrate according to claim 1, wherein the display substrate is divided into a plurality of region pairs, each of the plurality of region pairs comprises a first pixel repetition unit and a second pixel repetition unit adjacent to each other in a direction parallel to the plurality of gate lines, any of the first pixel repetition unit and the second pixel repetition unit comprises two sets of sub-pixel regions adjacent to each other in a direction parallel to the plurality of data lines, and each set of sub-pixel regions comprises sub-pixel regions where sub-pixels of a plurality of colors and in a same row parallel to the plurality of gate lines are located;
  one of the plurality of gate lines is arranged between the two sets of sub-pixel regions, the quantity of the sub-pixel regions in the second pixel repetition unit is the same as the quantity of the sub-pixel regions in the first pixel repetition unit, and an arrangement of the sub-pixel regions in the second pixel repetition unit is the same as an arrangement of the sub-pixel regions in the first pixel repetition unit;
  a first data line and a second data line are arranged between the first pixel repetition unit and the second pixel repetition unit, the first data line is connected to a first TFT of the first pixel repetition unit, the second data line is connected to a second TFT of the second pixel repetition unit, and a sub-pixel region where the first TFT is located and a sub-pixel region where the second TFT is located are arranged in adjacent rows of sub-pixel regions and in adjacent columns of sub-pixel regions; and
  in any of the first pixel repetition units and the second pixel repetition units, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, and the sub-pixel region where the third TFT is located and the sub-pixel region where the fourth TFT is located are arranged at a first side of the one of the plurality of gate lines and a second side of the one of the plurality of gate lines respectively; and
  in any of the first pixel repetition units and the second pixel repetition units, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions.

12. The display substrate according to claim 1, wherein one TFT in one sub-pixel region of two adjacent sub-pixel regions in a same column of subpixel regions is connected to a data line at a first side of the same column of subpixel regions, and one TFT in another sub-pixel region of the two adjacent sub-pixel regions in the same column is connected to a data line at a second side of the same column of subpixel regions.

13. A display device, comprising the display substrate according to claim 1.

14. A method for driving a display device, comprising:
  turning on TFTs in two adjacent rows of sub-pixel regions at two sides of one of a plurality of gate lines simultaneously through the one of the plurality of gate lines; and
  applying a pixel voltage to each of the TFTs through a plurality of data lines,
  wherein the display device comprises a display substrate;
  the display substrate comprises the plurality of gate lines and the plurality of data lines;
  the plurality of gate lines crosses the plurality of data lines to define a plurality of sub-pixel regions;
  each of the plurality of sub-pixel regions comprises one TFT connected to one of the plurality of data lines;
  two rows of sub-pixel regions are arranged between two adjacent gate lines, and
  two of the plurality of data lines are arranged between two adjacent columns of sub-pixel regions, and TFTs in the two adjacent rows of sub-pixel regions at two sides of one gate line of the plurality of gate lines are connected to the gate line and connected to different data lines;

the display substrate further comprises:
a first common electrode line arranged parallel to the plurality of gate lines and arranged between two rows of sub-pixel regions which are arranged between the two adjacent gate lines;
a second common electrode line arranged parallel to the plurality of data lines and arranged between two adjacent columns of sub-pixel regions; and
an insulation layer arranged between the first common electrode line and the second common electrode line, wherein the insulation layer is provided with a via-hole at a position where an orthogonal projection of the first common electrode line onto the insulation layer crosses an orthogonal projection of the second common electrode line onto the insulation layer, and the first common electrode line is electrically connected to the second common electrode line through the via-hole.

15. The method according to claim 14, further comprising,
applying pixel voltages to a plurality of first sub-pixel regions in a condition that an image is being displayed, to form an electric field to drive liquid crystal molecules to be deflected,
wherein among the pixel voltages applied to the plurality of first sub-pixel regions, the quantity of pixel voltages having a first polarity is the same as the quantity of pixel voltages having a second polarity opposite to the first polarity, and absolute values of the pixel voltages having the first polarity are the same as absolute values of the pixel voltages having the second polarity; and
in the condition that the image is being displayed, a display region of the display substrate comprises the plurality of first sub-pixel regions and a plurality of other sub-pixel regions, and liquid crystal molecules in the plurality of other sub-pixel regions are incapable of being driving to be deflected by an electric field generated by pixel voltages applied to the plurality of other sub-pixel regions.

16. The method according to claim 14, further comprising:
applying a first group of pixel voltages to a plurality of sub-pixel regions in a first pixel region, wherein the first group of pixel voltages comprises n first pixel voltages having a first polarity and m second pixel voltages having a second polarity, and one pixel voltage of the first group of pixel voltages is applied to one sub-pixel region in the first pixel region; and
applying a second group of pixel voltages to a plurality of sub-pixel regions in a second pixel region, wherein the second group of pixel voltages comprises p third pixel voltages having the first polarity and q fourth pixel voltages having the second polarity, and one pixel voltage of the second group of pixel voltages is applied to one sub-pixel region in the second pixel region, wherein n+p=m+q, and n, m, p and q are each a positive integer,
wherein the display substrate is divided into a first region and a second region in a direction parallel to the plurality of data lines, the quantity of sub-pixel regions in the first region is the same as the quantity of sub-pixel regions in the second region, and an arrangement of the sub-pixel regions in the first region is the same as an arrangement of the sub-pixel regions in the second region;
a first data line and a second data line are arranged between the first region and the second region, the first data line is connected to a first TFT in the first region, the second data line is connected to a second TFT in the second region, a sub-pixel region where the first TFT is located and a sub-pixel region where the second TFT is located are arranged in adjacent rows of sub-pixel regions and in adjacent columns of sub-pixel regions, and the sub-pixel region where the first TFT is located and the sub-pixel region where the second TFT is located are arranged at two sides of one of the plurality of gate lines;
in any of the first region and the second region, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, the sub-pixel region where the third TFT is located and the sub-pixel region where the fourth TFT is located are arranged at two sides of one of the plurality of gate lines;
in any of the first region and the second region, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions; and
in the condition that an image is being displayed, the display substrate comprises the first pixel region and the second pixel region, the first pixel region comprises bright-state sub-pixel regions in the first region, the second pixel region comprises bright-state sub-pixel regions in the second region, and the quantity of sub-pixel regions in the first pixel region is the same as the quantity of sub-pixel regions in the second pixel region.

17. The method according to claim 16, wherein the first pixel region comprises a first red pixel region, a first green pixel region and a first blue pixel region, and the first group of pixel voltages comprises a first red pixel voltage having a positive polarity and applied to the first red pixel region, a first green pixel voltage having a negative polarity and applied to the first green pixel region, and a first blue pixel voltage having a positive polarity and applied to the first blue pixel region;
the second pixel region comprises a second red pixel region, a second green pixel region and a second blue pixel region, the second group of pixel voltages comprises a second red pixel voltage having a positive polarity and applied to the second red pixel region, a second green pixel voltage having a negative polarity and applied to the second green pixel region, and a second blue pixel voltage having a positive polarity and applied to the second blue pixel region; and
absolute values of the red pixel voltages, the green pixel voltages and the blue pixel voltages are the same.

18. The method according to claim 14, further comprising:
dividing a pixel region of the display substrate into a plurality of region pairs in a condition that an image is being displayed,
wherein each of the plurality of region pairs comprises a first pixel repetition unit and a second pixel repetition unit adjacent to each other in a direction parallel to the plurality of gate lines, the first pixel repetition unit comprises two sets of sub-pixel regions adjacent to each other in a direction parallel to the plurality of data lines, each of the two sets of sub-pixel regions comprises sub-pixel regions where sub-pixels of a plurality of colors and in a same row parallel to the plurality of gate lines are located, a first gate line is arranged between the two sets of sub-pixel regions, the quantity of sub-pixel regions in the second pixel repetition unit is the same as the quantity of sub-pixel regions in the first pixel repetition unit, an arrangement of the sub-pixel regions in the second pixel repetition unit is the same as an arrangement of the sub-pixel regions in the first pixel repetition unit, a first data line and a second data line are arranged between the first pixel repetition unit and the second pixel repetition unit, the first data line is connected to a first TFT of the first pixel repetition unit, the second data line is connected to a second TFT of the second pixel repetition unit, a sub-pixel region where the first TFT is located and a sub-pixel region where the second TFT is located are arranged in adjacent rows of sub-pixel regions and in adjacent columns of sub-pixel regions; in any of the first pixel repetition units and the second pixel repetition units, a third data line and a fourth data line are arranged between two adjacent columns of sub-pixel regions, the third data line is connected to a third TFT, the fourth data line is connected to a fourth TFT, a sub-pixel region where the third TFT is located and a sub-pixel region where the fourth TFT is located are arranged in a same row of sub-pixel regions and in adjacent columns of sub-pixel regions, and the sub-pixel region where the third TFT is located and the sub-pixel region where the fourth TFT is located are arranged at two sides of one of the plurality of gate lines; in any of the first pixel repetition units and the second pixel repetition units, a fifth TFT is connected to a fifth data line arranged at an edge of the display substrate, a sixth TFT is connected to a data line adjacent to the fifth data line, the fifth TFT and the sixth TFT are connected to a same gate line, and a sub-pixel region where the fifth TFT is located and a sub-pixel region where the sixth TFT is located are in a same column of sub-pixel regions and in adjacent rows of sub-pixel regions;

applying first pixel voltages to a first set of sub-pixel regions in the first pixel repetition unit at a first side of the first gate line, and applying second pixel voltages to a second set of sub-pixel regions in the first pixel repetition unit at a second side of the first gate line; and applying third pixel voltages to a first set of sub-pixel regions in the second pixel repetition unit at the first side of the first gate line, and applying fourth pixel voltages to a second set of sub-pixel regions in the second pixel repetition unit at the second side of the first gate line, wherein an electric field generated by the first pixel voltages is capable of driving liquid crystal molecules to be deflected, an electric field generated by the second pixel voltages is incapable of driving liquid crystal molecules to be deflected, the first pixel voltages comprise first voltages having a first polarity and second voltages having a second polarity, the quantity of the first voltages is N, and the quantity of the second voltages is M; and an electric field generated by the third pixel voltages is incapable of driving the liquid crystal molecules to be deflected, an electric field generated by the fourth pixel voltages is capable of driving the liquid crystal molecules to be deflected, the fourth pixel voltages comprise third voltages having a first polarity and fourth voltages having a second polarity, the quantity of the third voltages is P, the quantity of the fourth voltages is Q, an absolute value of each of the first pixel voltages is the same as an absolute value of each of the third pixel voltages, N+P=M+Q, and N, M, P and Q are each a positive integer.

* * * * *